United States Patent [19]

Lapinski et al.

[11] Patent Number: 5,005,640
[45] Date of Patent: Apr. 9, 1991

[54] ISOTHERMAL MULTI-PASSAGE COOLER

[75] Inventors: John R. Lapinski, St. Charles; Michael G. Grote, St. Louis, both of Mo.

[73] Assignee: McDonnell Douglas Corporation, Long Beach, Calif.

[21] Appl. No.: 584,405

[22] Filed: Sep. 17, 1990

Related U.S. Application Data

[63] Continuation of Ser. No. 361,394, Jun. 5, 1989, abandoned.

[51] Int. Cl.[5] .............................................. F28F 3/12
[52] U.S. Cl. .................................. 165/170; 165/80.4; 165/142; 165/185; 357/82; 361/385
[58] Field of Search .............. 165/804, 142, 169, 170, 165/185; 62/51.1, 51.2; 357/82; 361/385

[56] References Cited

U.S. PATENT DOCUMENTS

| | | | |
|---|---|---|---|
| 3,098,165 | 7/1963 | Zitelli | 165/80.4 |
| 3,637,296 | 1/1972 | McLafferty et al. | 350/310 |
| 3,708,223 | 1/1973 | Sorensen et al. | 350/310 |
| 3,884,558 | 5/1975 | Dunn et al. | 350/310 |
| 3,909,118 | 9/1975 | Schmidt | 350/310 |
| 4,107,919 | 8/1978 | Sokolowski | 165/169 |
| 4,386,505 | 6/1983 | Little | 62/51.1 |
| 4,392,362 | 7/1983 | Little | 62/51.1 |
| 4,489,570 | 12/1984 | Little | 62/51.1 |
| 4,546,621 | 10/1985 | Kline et al. | 62/51.1 |
| 4,628,991 | 12/1986 | Hsiao et al. | 165/170 |
| 4,714,107 | 12/1987 | Adsett | 165/170 |

OTHER PUBLICATIONS

Tuckerman et al. "High-Performance Heat Sinking for VLSI", IEEE Electron Device Letters vol. EDL2 No. 5, May 1981, pp. 126–129.
Bland et al. "A Compact High Intensity Coder (CHIC)", SAE Technical Paper Series 831,127 1983 pp. 1–13.

*Primary Examiner*—John Ford
*Attorney, Agent, or Firm*—Donald E. Stout; Gregory A. Cone; John P. Scholl

[57] ABSTRACT

A thin multi-passage cooler that produces an isothermal heating surface, high heat transfer coefficients, without producing an excessive pressure drop across the coolant passages. The cooler having a plurality of first passages in fluid communication with a plurality of second passages. A coolant flows through the second passages and then through first passages which are in close proximity to a heating source. The first and second passages are oriented and connected such that the direction of coolant flow in the first passages is opposite to the direction of flow in the second passages. To promote high heat transfer coefficients the passages are constructed to have large length to width ratios and small hydraulic diameters.

8 Claims, 3 Drawing Sheets

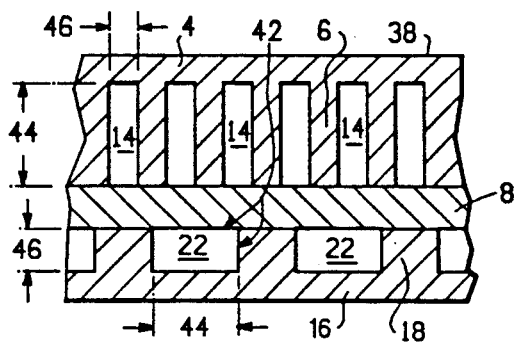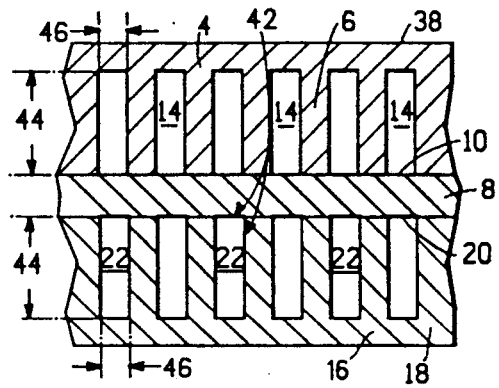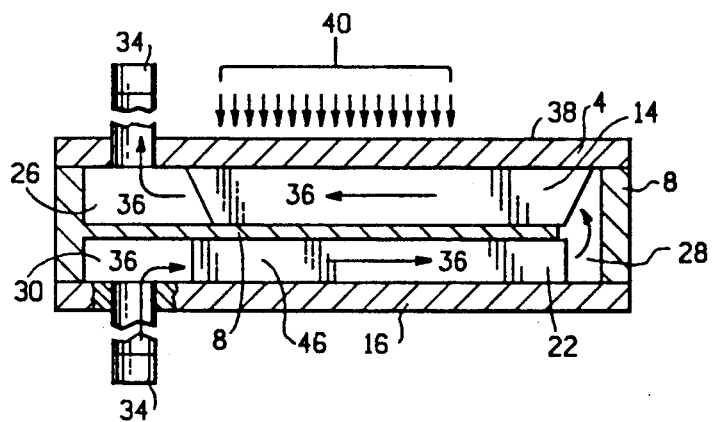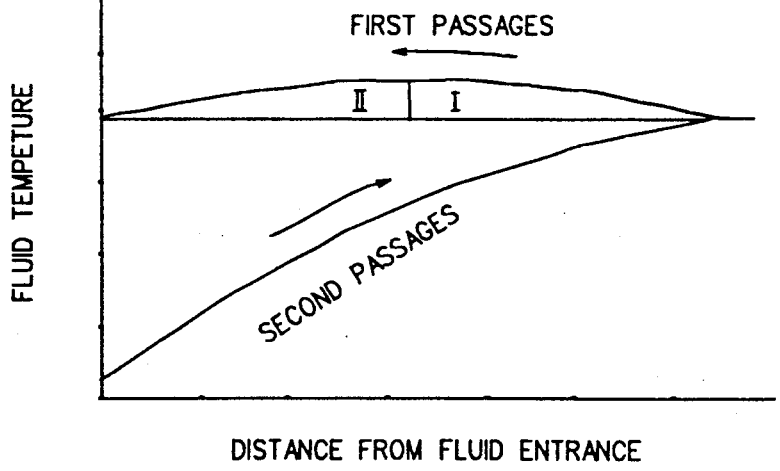

ISOTHERMAL MULTI-PASSAGE COOLER

This is a continuation of application Ser. No. 361,394, filed June 5, 1989 now abandoned.

FIELD OF INVENTION

This invention relates to a multi-passage regenerative cooler that produces an isothermal heating surface.

BACKGROUND OF THE INVENTION

Light emitting diodes (LED's) are frequently used as the source of light for lasers. Typically, thousands of LED's are required to effectively power a laser. To minimize the size of all of these diodes, a single GaAs bar is doped in a manner to produce 40 to 400 LED's in the bar and then the bars are stacked on top of each other creating a "lighting rod".

The laser diode bars can generate average heat fluxes ranging from 5 W/cm$^2$ to 125 W/cm$^2$ and must operate at or below 25° C. To ensure that the temperature of the diodes do not exceed 25° C., the diodes are directly mounted to a cooler capable of removing large amounts of heat, without producing large temperature differentials between the coolant of the cooler and the bar. The cooler should be thin in the range of 0.150 cm, to allow the bars and coolers to stack on top of each other, and have low coolant passage pressure drops such that the cooler can used with standard chillers.

It is essential to have all of the diodes operating within 1° C. of each other, so that the diodes produce light at the same wavelength. Therefore, the cooler should not only be thin and have high heat transfer coefficients, but should also produce an isothermal mounting surface.

McLafferty et al., U.S. Pat. No. 3,637,296, discloses a thin heat cooler with cooling passages in close proximity to the heating surface, where the cooling fluid flows through all the passages in the same direction, which effectively cools the mounting surface but produces a temperature gradient along the heating surface.

Sorensen et al., U.S. Pat. No. 3,708,223, reveals a thin cooler with cooling passages in close proximity to the mounting surface. The coolant flows through adjacent passages in opposite directions to balance the temperature of the heating surface along the length of the passages.

Dunn III et al., U.S. Pat. No. 3,884,558, discloses a thin cooler with a plurality of first cooling passages in close proximity to the mounting surface. The coolant flows in opposite directions in adjacent first passages and then passes through a plurality of second passages oriented perpendicular to the first passages. Passing the coolant through the second passages further equalizes the temperature throughout the heating surface.

Schmidt et al., U.S. Pat. No. 3,909,118, and the article, Bland, Niooemann and Parekh. "A Compact High Intensity Cooler (Chic)", SAE Technical Paper Series 831127, July 11-13, 1983, discloses a thin jet impingment cooler, where the coolant passages are perpendicular to the heating surface. The orientation of the passages allows the coolant to thermally scrub the back surface of the mounting plate, producing an even temperature gradient throughout the mounting plate.

Tuckerman and Pease, "High-Performance Heat Sinking for VSLI", IEEE Electron Device Letters, Vol. EDL-2, No. 5, May, 1981, discusses a cooler that accomplishes high forced convection heat transfer coefficients by providing a plurality of very small cooling passages.

Of the patents and publications discussed, only the "Chic" cooler appeared to combine a thin width with high heat transfer coefficients and an isothermal mounting surface. Yet when the "Chic" cooler was tested with a heat flux of 125 W/cm$^2$ it produced temperature gradients of 3.5° C., a result which did not comply with the laser requirement of 1° C.

SUMMARY OF INVENTION

This invention is a cooler less than 0.150 cm thick, that produces both an isothermal heating surface and high heat transfer coefficients, without producing an excessive pressure drop in the coolant passages The cooler has a plurality of first passages in fluid communication with a plurality of second passages. The first and second passages are oriented and connected such that, when a coolant passes through the passages, the direction of flow in the first passages is opposite to the direction of flow in the second passages. To promote high heat transfer coefficients the passages are constructed to have large length to width ratios and small hydraulic diameters.

A coolant is circulated across the second passages and then through the first passages. Heat is applied to the cooler heating surface, which is in close proximity to the first passages. The heat conducts through the first passage walls and into the coolant of the second passages Because a majority of the heat transfers into the second passages, the temperature rise along the first passages is minimal. The heating surface being in close proximity to the first passages, assumes the same constant temperature profile as the first passages.

When tested, this invention produced lower temperature gradients than the "Chic" cooler, producing temperature gradients of 0.7° C. with a heat load of 125 W/cm$^2$, and cooling water flowing at 10 kg/hr. In addition, this invention had higher overall thermal conductance, resulting in lower heating surface temperatures.

It is an object of this invention to provide a cooler that produces a minimal temperature gradient along the thermal interface of the cooler It is an object of this invention to provide a cooler that produces a minimal temperature gradient along the thermal interface of the cooler, without producing an excessive pressure drop across the coolant passages It is an object of this invention to provide a cooler that has high heat transfer coefficients and produces a minimal temperature gradient along the thermal interface of the cooler, without producing an excessive pressure drop across the coolant passages.

It is an object of this invention to provide a thin cooler that has high heat transfer coefficients and produces a minimal temperature gradient along the thermal interface of the cooler, without producing an excessive pressure drop across the coolant passages.

BRIEF DESCRIPTION OF THE DRAWINGS

FIG. 3a is a cross-section of a cooler showing the first and second passages;

FIG. 3b is a cross-section of a cooler showing the first and second passages, where the second passages have a different shape than shown in FIG. 3a;

FIG. 4 is a cross-section of a cooler showing the direction of coolant flow;

FIG. 5 is a graph showing the temperature of a coolant as it flows through cooler passages.

DETAILED DESCRIPTION OF THE INVENTION

Figure 1:
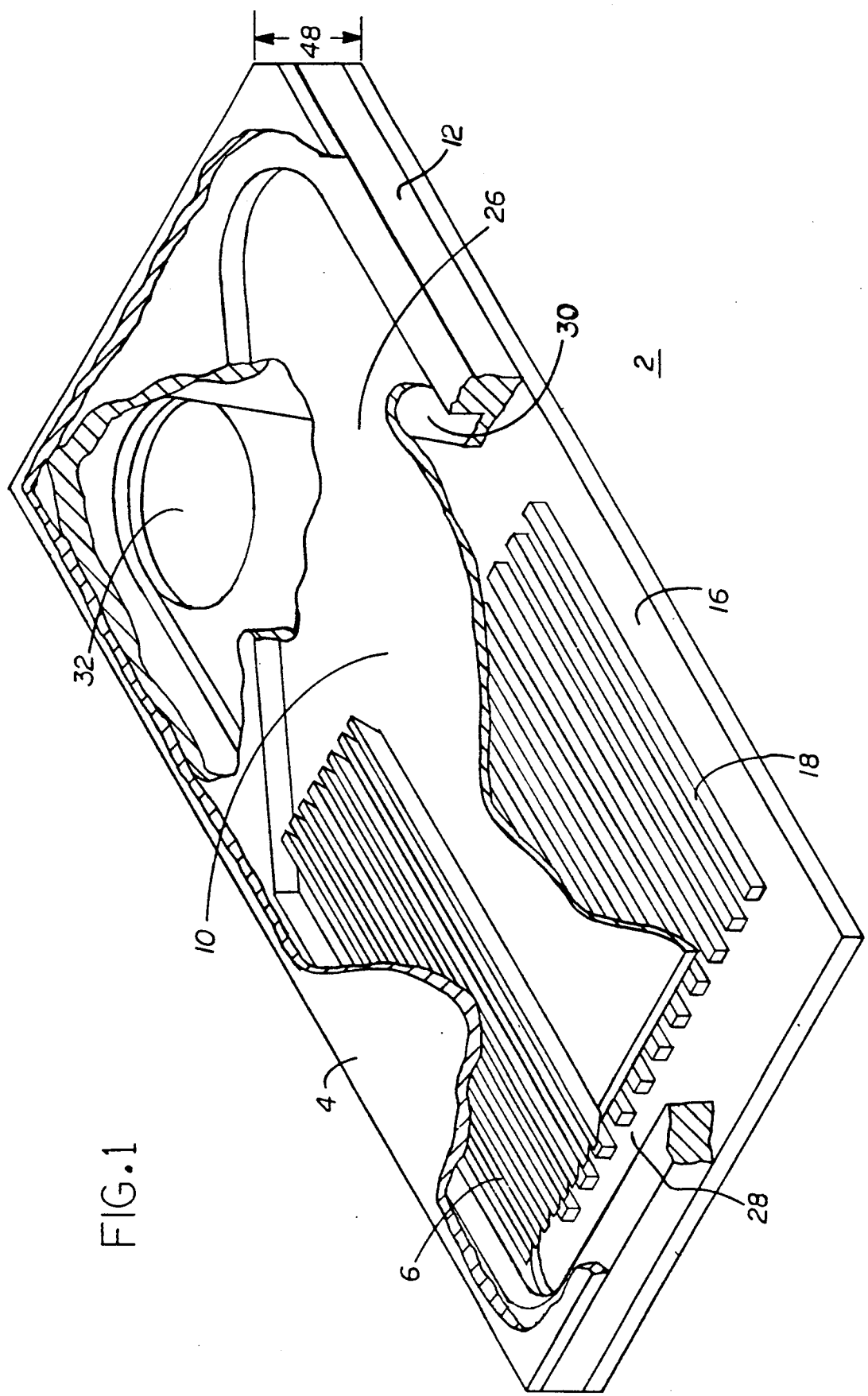
FIG. 1 is a cooler showing the inlets, manifolds and passage walls.
Figure 2:
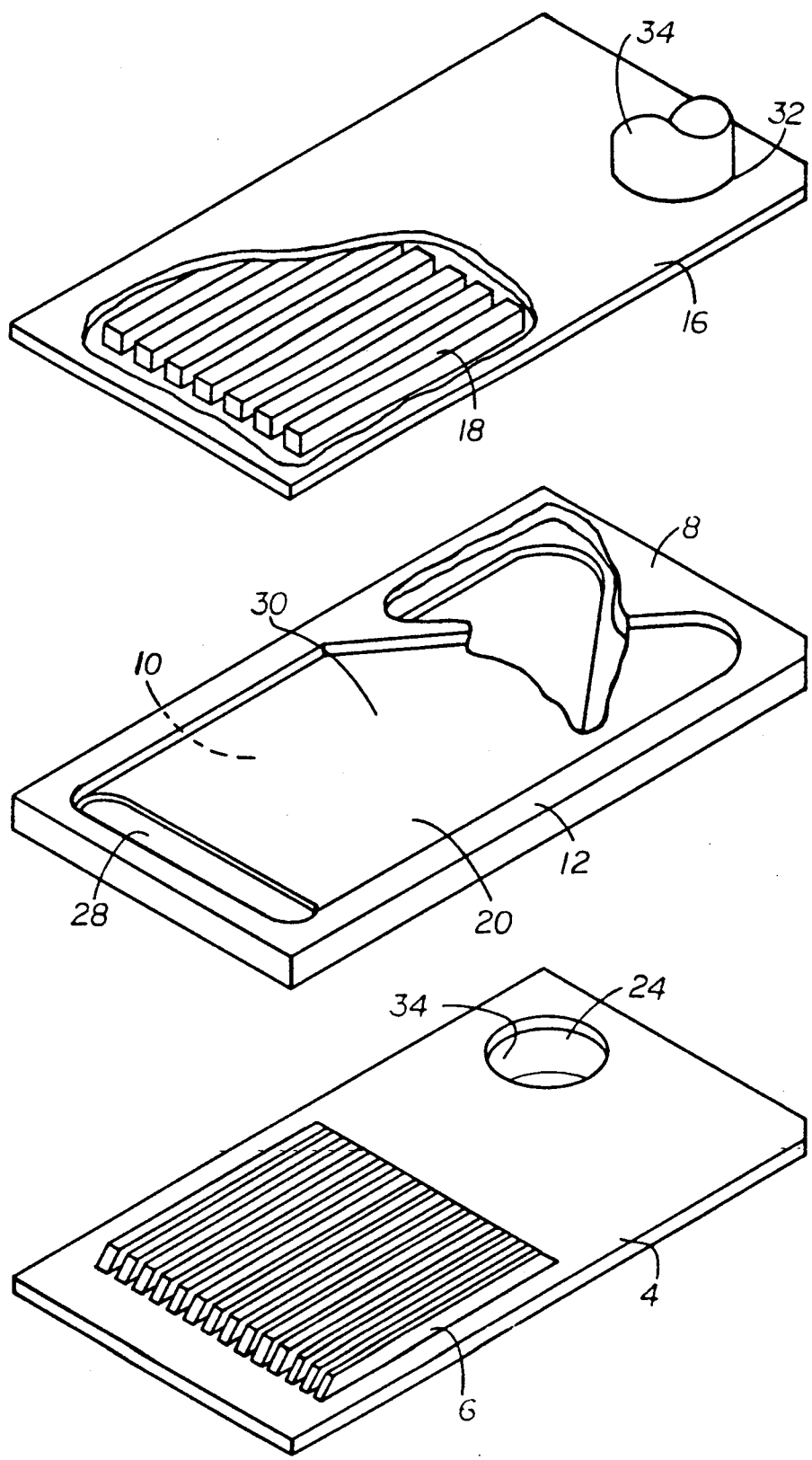
FIG. 2 shows the first, second and third plates of a cooler rotated 180 degrees from FIG. 1.

Referring to the drawings more particularly by reference numbers, number 2 in FIG. 1 is a dual channel cooler 2. The cooler can be constructed from three plates, see FIG. 2. The first plate 4 has a plurality of parallel first passage walls 6 extending perpendicular from the first plate 4. An edge plate 8 has a first recessed surface 10, recessed from the edge walls 12 of the edge plate 8, see FIG. 2. The first plate 4 and first passage walls 6 are diffusion bonded to the edge walls 12 and first recessed surface 10 respectively, the spaces between the first plate 4, first recessed surface 10 and first passage walls 6 defining a plurality of first passages 14, 5 see FIG. 3a.

A second plate 16 has a plurality of parallel second passage walls 18 extending perpendicular from the second plate 16. The edge plate 8 having a second recessed surface 20, recessed from the edge walls 12 of the edge plate 8. The second plate 16 and second passage walls 18 are diffusion bonded to the edge walls 12 and second recessed surface 20 respectively, the spaces between the second plate 16, second recessed surface 20 and second passage walls 18 defining a plurality of second passages 22, see FIG. 3a.

A first opening 24 is drilled into the end of the first plate 4. A first manifold 26 is in fluid communication with the first opening 24. The first manifold 26 is defined by the space between the first plate 4, first recessed surface 10 and the edge walls 12 of the edge plate 8. The first manifold 26 is in fluid communication with the first passages 14 and has a triangular shape to provide an equal distribution of fluid from each first passage 14. A second manifold 28 provides a means for fluid to communicate from the first passages 14 to the second passages 22. The second manifold 28 is a long slot in the edge plate 8 at the end of the first 10 and second 20 recessed surfaces.

A third manifold 30 is in fluid communication with the second passages 22 and has a triangular shape to provide an equal distribution of fluid to each second passage 22. The third manifold 30 is defined by the space between the second plate 16, second recessed surface 20 and the edge walls 12 of the edge plate 8. A second opening 32 is drilled into the end of the second plate 16 and is in fluid communication with the third manifold 30. After the first plate 4, edge plate 8 and second plate 16 are diffusion bonded, tubes 34 are soldered to the first plate 4 and second plate 16 at the first 24 and second 32 openings.

A coolant 36 flows through the second opening 32 and into the third manifold 30 which evenly distributes the fluid into the second passages 22, see FIG. 4. The coolant 36 flows along the second passages 22 and through the second manifold 28 into and through the first passages 14. The coolant 36 flow along the second passages 22, is in a direction opposite to the direction of coolant 36 flow in the first passages 14. The coolant 36 flows through the first passages 14 into the first manifold 26, which directs the coolant 36 into and through the first opening 24. The coolant 36 could be water, freon or other similar fluids operating in one or two-phase regions.

Heat is applied to a heating surface 38 of the cooler 2, from a heat source 40 such as diodes mounted to the first plate 4. The heating surface 38 being the surface of the first plate 4 opposite the first passages 14. The heat conducts through the first plate 4, down the first passage walls 6, conducting through the edge wall 8 and second passage walls 18 into the coolant 36 of the second passages 22.

A majority of the heat 40 flows into the second passages 22 instead of the first passages 14 for two reasons. First, the thermal resistance of the conductive path 42 from the surface 38 to the second passages 22, is much smaller than the convective thermal resistance between the passage walls 14 and 22 and the coolant 36. To ensure this balance, the cooler 2 should be constructed from a highly thermally conductive material such as copper, aluminum or berylium. Secondly, once the heat has conducted into the first 6 and second 18 passage walls it will then transfer into the coolant 36 of the passage 14 and 22 with the lowest temperature. In a thermally dynamic situation the heat will initially flow into both the first 14 and second 22 passages. The temperature of the coolant 36 in the first passages 14 will be higher than the temperature of the coolant 36 in the second passages 22, because the coolant 36 flows through the second passages 22 first, where it absorbs heat and then passes across the first passages 14. As the coolant 36 temperature in the first passages 14 increases, more heat transfers into the coolant 36 of the second passages 22. This change of heat 40 flow and coolant 36 temperature continues until the cooler 2 attains the temperature profile shown in FIG. 5, where a majority of the heat transfer and corresponding rise in coolant 36 temperature occurs in the second passages 22.

As the temperature of the coolant 36 rises in the second passages 22, a small amount of heat transfers into the coolant 36 in the first passages 14 as indicated by the temperature rise of the coolant 36 in region I of FIG. 5. As the coolant 36 flows across the first passages 14, the heat in the coolant 36 transfers from the first passages 14 into the colder portion of the second passages 22, as indicated by the decrease in the coolant 36 temperature in region II of FIG. 5.

Because there is little thermal resistance between the heating surface 38 and the first passages 14, the heating surface 38 has the same temperature gradient as the first passages 14, as shown in FIG. 5. If the heat source 40 is mounted directly on the heating surface 38 it will also have the same temperature profile as the first passages 14.

To provide the lowest heating surface 38 temperature and to promote heat flow between the first 14 and second 22 passages in region II of FIG. 5, the heat transfer coefficient between the passage walls 6 and 18 and the coolant 36 should be as high as possible. To obtain high heat transfer coefficients in excess of 10,000 W/m$^2$K for water flowing at 10 kg/hr, the passage length 44 should be at least twice the passage width 46 and the hydraulic diameter of the passages defined by;

$$D = 2*l*w/(l + w)$$
$$l = \text{passage length 44}$$
$$w = \text{channel width 46}$$

should be less than 0.025 cm. The second passages 22 may have a shape as shown in FIG. 3a, resulting in low pressure drops, or have the configuration as shown in FIG. 3b, which produces lower overall thermal conductivity due to the increase in passage heat exchanging area.

The overall width of the cooler 48 should be in the range of 0.150 cm, a dimension that is especially desirable when the cooler is used in electronic packaging. To accomplish this thickness the first plate 4 and first passage walls 6, second plate 16 and second passage walls 18 and the edge plate 8 should be machined from sheets approximately 0.050 cm thick. The first 6 and second 18 passage walls can be manufactured by sawing grooves into the first 4 and second 16 plates, respectively.

What is claimed is:

1. An isothermal cooler for cooling a heat source, comprising:
   (a) a first plate constructed of a highly thermally conductive material and having a heating surface along a length of a first side of said plate which is adapted to attach to the heat source, a plurality of thermally conductive first passage walls attached to a second side of said first plate, said first passage walls defining a plurality of first passages having a length parallel to said heating surface length, said first plate having a first opening;
   (b) a highly thermally conductive edge plate attached to said first plate and said first passage walls, said edge plate having a first manifold in fluid communication with said first opening and said first passages at one end thereof, a second manifold in fluid communication with said first passages at an opposite end thereof, and a third manifold at said one end thereof;
   (c) a second plate having a plurality of thermally conductive second passage walls attached to said second plate and said edge plate, said second passage walls defining a plurality of second passages in fluid communication with said second and third manifolds, said second plate having a second opening in fluid communication with said third manifold; and
   (d) a fluid that flows into said second opening, through said third manifold, across said second passages through said second manifold, across said first passages, through said first manifold and out of said first opening, whereby said first plate heating surface is substantially isothermal along its length.

2. The cooler as recited in claim 1 wherein said plurality of first passages are parallel with said plurality of second passages.

3. The cooler as recited in claim 2 wherein each second passage has a length to width ratio greater than two.

4. The cooler as recited in claim 2 wherein the hydraulic diameter of each second passage is less than 0.025 cm.

5. The cooler as recited in claim 3 wherein the hydraulic diameter of each second passage is less than 0.025 cm.

6. The cooler as recited in claim 2 wherein each first and second passage has a length to width ratio greater than two.

7. The cooler as recited in claim 2 wherein the hydraulic diameter of each first and second passage is less than 0.025 cm.

8. The cooler as recited in claim 6 wherein the hydraulic diameter of each first and second passage is less than 0.025 cm.

* * * * *